(12) United States Patent
Beeson et al.

(10) Patent No.: US 7,352,124 B2
(45) Date of Patent: Apr. 1, 2008

(54) LIGHT RECYCLING ILLUMINATION SYSTEMS UTILIZING LIGHT EMITTING DIODES

(75) Inventors: Karl W. Beeson, Princeton, NJ (US); Scott M. Zimmerman, Baskin Ridge, NJ (US)

(73) Assignee: Goldeneye, Inc., San Diego, CA (US)

( * ) Notice: Subject to any disclaimer, the term of this patent is extended or adjusted under 35 U.S.C. 154(b) by 417 days.

(21) Appl. No.: 10/952,229

(22) Filed: Sep. 28, 2004

(65) Prior Publication Data

US 2006/0066192 A1    Mar. 30, 2006

(51) Int. Cl.
*H05B 33/00* (2006.01)
*H05B 33/24* (2006.01)

(52) U.S. Cl. ............... 313/501; 313/503; 313/506; 313/112; 313/110; 362/555; 362/800; 257/98; 257/100

(58) Field of Classification Search ........ 313/498–512; 257/98–100
See application file for complete search history.

(56) References Cited

U.S. PATENT DOCUMENTS

| | | | |
|---|---|---|---|
| 5,410,454 A | 4/1995 | Murase et al. | |
| 6,144,536 A | 11/2000 | Zimmerman et al. | |
| 6,185,357 B1 | 2/2001 | Zou et al. | |
| 6,186,649 B1 | 2/2001 | Zou et al. | |
| 6,417,019 B1 | 7/2002 | Mueller et al. | |
| 6,550,942 B1 | 4/2003 | Zou et al. | |
| 6,576,930 B2 | 6/2003 | Reeh et al. | |
| 6,586,874 B1 * | 7/2003 | Komoto et al. | 313/503 |
| 6,804,058 B1 * | 10/2004 | Ouderkirk et al. | 359/494 |
| 6,934,082 B2 * | 8/2005 | Allen et al. | 359/487 |
| 7,091,661 B2 * | 8/2006 | Ouderkirk et al. | 313/512 |
| 7,135,712 B2 * | 11/2006 | Broer et al. | 257/98 |
| 7,192,147 B2 * | 3/2007 | Sakata et al. | 362/19 |
| 2002/0093284 A1 | 7/2002 | Adachi et al. | |
| 2005/0127377 A1 * | 6/2005 | Arndt et al. | 257/99 |

FOREIGN PATENT DOCUMENTS

WO    WO 2003049204 A2 *    6/2003

* cited by examiner

*Primary Examiner*—Mariceli Santiago
(74) *Attorney, Agent, or Firm*—William Propp, Esq.

(57) ABSTRACT

This invention is an illumination system that incorporates a light emitting diode and a partially reflecting optical element. The light emitting diode emits internally generated light and reflects incident light with high reflectivity. The partially reflecting optical element transmits a first portion of the internally generated light and reflects a second portion of the internally generated light back to the light emitting diode, where the second portion is reflected by the light emitting diode. The partially reflecting optical element can be a non-absorbing reflecting polarizer or a wavelength conversion layer. Utilizing a partially reflecting optical element and light recycling can increase the effective brightness and the output efficiency of the illumination system.

9 Claims, 4 Drawing Sheets

LIGHT RECYCLING ILLUMINATION SYSTEMS UTILIZING LIGHT EMITTING DIODES

CROSS REFERENCES TO RELATED APPLICATIONS

This application is related to U.S. patent application Ser. No. 10/445,136 entitled "ILLUMINATION SYSTEMS UTILIZING HIGHLY REFLECTIVE LIGHT EMITTING DIODES AND LIGHT RECYCLING TO ENHANCE BRIGHTNESS," to U.S. patent application Ser. No. 10/814,043 entitled "ILLUMINATION SYSTEMS UTILIZING LIGHT EMITTING DIODES AND LIGHT RECYCLING TO ENHANCE OUTPUT RADIANCE" and to U.S. patent application Ser. No. 10/814,044 entitled "ILLUMINATION SYSTEMS UTILIZING MULTIPLE WAVELENGTH LIGHT RECYCLING," all of which are herein incorporated by reference.

This application is also related to U.S. patent application Ser. No. 10/952,112 entitled "LIGHT EMITTING DIODES EXHIBITING BOTH HIGH REFLECTIVITY AND HIGH LIGHT EXTRACTION," U.S. patent application Ser. No. 10/977,923 entitled "HIGH BRIGHTNESS LIGHT EMITTING DIODE LIGHT SOURCE" and U.S. patent application Ser. No. 10/952,230 entitled "LIGHT RECYCLING ILLUMINATION SYSTEMS HAVING RESTRICTED ANGULAR OUTPUT," all of which are filed concurrently with this application and are herein incorporated by reference.

TECHNICAL FIELD

The present invention relates to illumination systems incorporating light emitting diodes and partially reflecting optical elements.

BACKGROUND

Illumination systems that contain blackbody light sources such as arc lamp sources or incandescent sources are usually designed so that no light is reflected or recycled back to the source. Blackbody light sources are excellent light absorbers and poor light reflectors. Any emitted light that does get back to the source is absorbed and lost, lowering the overall efficiency of the illumination system.

Certain types of light sources, such as some fluorescent light sources and some light emitting diodes (LEDs), can reflect light as well as emit light. Reflecting light sources can be used in illumination systems that recycle light back to the source. Recycled light that is returned to the source and that is reflected by the source can increase the effective brightness of the source. In addition, light sources that can reflect light instead of absorbing light can reduce absorption losses and increase the overall output efficiency of such illumination systems.

U.S. patent application Ser. No. 10/445,136, U.S. patent application Ser. No. 10/814,043 and to U.S. patent application Ser. No. 10/814,044 describe light recycling systems that include light recycling cavities or envelopes that enclose one or more light reflecting LEDs. The light reflecting cavities or envelopes reflect and recycle a portion of the light emitted by the LEDs back to the LEDs. The light recycling cavity or envelope has an output aperture with an area that is smaller than the total emitting area of the enclosed LEDs. In such cases, it is possible for the light exiting the cavity or envelope to be brighter than an equivalent LED measured in the absence of recycling. The three aforementioned applications disclose illumination systems that incorporate light recycling cavities or envelopes, but do not disclose illumination systems that lack light recycling cavities or envelopes.

U.S. patent application Publication No. 20020093284 describes a light-emitting display device with a reflective element behind an organic light-emitting layer. Cholesteric liquid crystal polarization separators, a quarter-wave plate and a polarizer are formed on the organic light-emitting layer. The light-emitting device is a display device. Any ambient light from outside the device, which is incident on the device, is absorbed by the polarizer to prevent reflection of the ambient light. The polarization separators reflect circularly polarized light, which is converted to linearly polarized light; a portion of the linearly polarized light is absorbed by the polarizer.

It would be desirable to design illumination systems that utilize light emitting diode light sources and light recycling but that do not require a light recycling cavity or envelope. It would be desirable to design illumination systems that maximize emitted light and maximize the reflection of incident light. Such systems can have increased output brightness and efficiency compared to systems that do not recycle light.

SUMMARY OF THE INVENTION

This invention is an illumination system that incorporates a light emitting diode and a partially reflecting optical element. The light emitting diode emits internally generated light and reflects incident light with high reflectivity. The partially reflecting optical element transmits a first portion of the internally generated light and reflects a second portion of the internally generated light back to the light emitting diode, where the second portion is reflected by the light emitting diode. The partially reflecting optical element can be a non-absorbing reflecting polarizer or a wavelength conversion layer. Utilizing light recycling can increase the effective brightness and the output efficiency of the illumination system.

BRIEF DESCRIPTION OF THE DRAWINGS

A more detailed understanding of the present invention, as well as other objects and advantages thereof not enumerated herein, will become apparent upon consideration of the following detailed description and accompanying drawings, wherein.

DETAILED DESCRIPTION OF THE PREFERRED EMBODIMENTS

The preferred embodiments of the present invention will be better understood by those skilled in the art by reference to the above figures. The preferred embodiments of this invention illustrated in the figures are not intended to be exhaustive or to limit the invention to the precise form disclosed. The figures are chosen to describe or to best explain the principles of the invention and its applicable and practical use to thereby enable others skilled in the art to best utilize the invention.

An LED of this invention incorporates a multi-layer semiconductor structure that emits light. Inorganic light-emitting diodes can be fabricated from materials containing gallium nitride (GaN), including the materials aluminum gallium nitride (AlGaN) and indium gallium nitride (InGaN). Other appropriate LED materials are aluminum nitride (AlN), aluminum indium gallium phosphide (AlInGaP), gallium arsenide (GaAs), indium gallium arsenide (InGaAs) or indium gallium arsenide phosphide (InGaAsP), for example, but are not limited to such materials. Especially important LEDs for this invention are GaN-based LEDs that emit light in the ultraviolet, blue, cyan and green region of the optical spectrum and AlInGaP LEDs that emit light in the yellow and red regions of the optical spectrum.

Figure 1A:
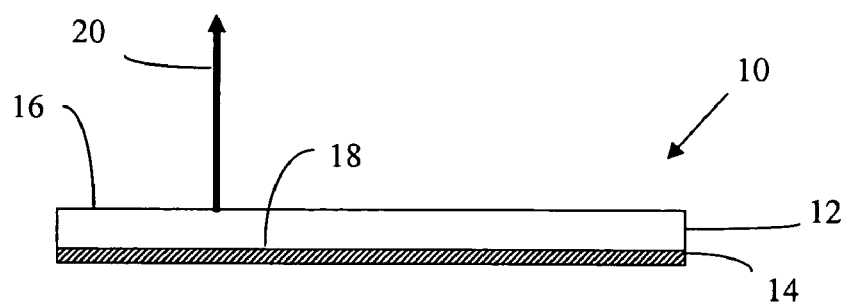
FIG. 1A is a simplified schematic view of the cross-section of a preferred light emitting diode used in this invention.

FIG. 1A is a simplified schematic diagram of the cross-section of LED 10. FIG. 1A is an illustrative example. The LED 10 does not show all the elements of a reflective LED for ease of understanding the present invention in FIG. 2 and the subsequent figures. LED 10 is comprised of a multi-layer semiconductor structure 12 and a reflecting layer 14. Multi-layer semiconductor structure 12 is a simplified representation of a multi-layer group of elements that normally includes at least an n-doped layer, a p-doped layer and an active layer that emits internally generated light. The active layer is typically a multi-quantum well structure and is located between the n-doped layer and the p-doped layer. Multi-layer semiconductor structure 12 has a surface 16 through which the internally generated light 20 exits the multi-layer semiconductor structure. Surface 18 of the multi-layer semiconductor structure 12 is in contact with reflecting layer 14. The multi-layer semiconductor structure is usually not completely transparent and does absorb some of the internally generated light before the light exits LED 10. The absorption coefficient for the multi-layer semiconductor structure 12 for GaN-based LEDs ranges from approximately 10 $cm^{-1}$ to approximately 200 $cm^{-1}$ in the wavelength region from 400-600 nanometers.

Figure 1B:
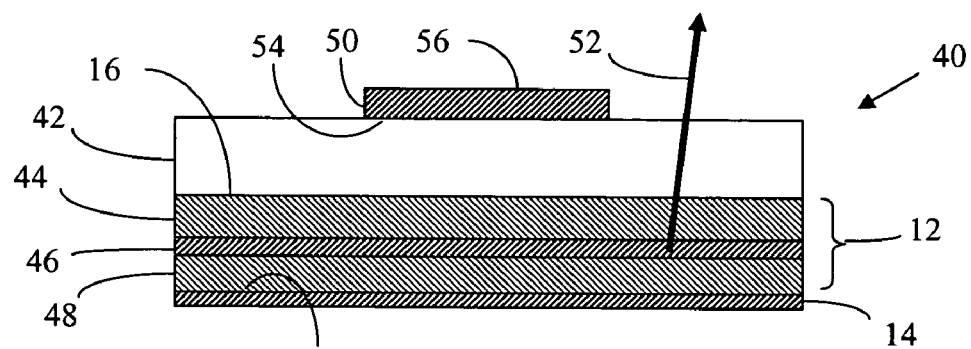
FIGS. 1B-1D are cross-sectional views of example LED structures.
Figure 1C:
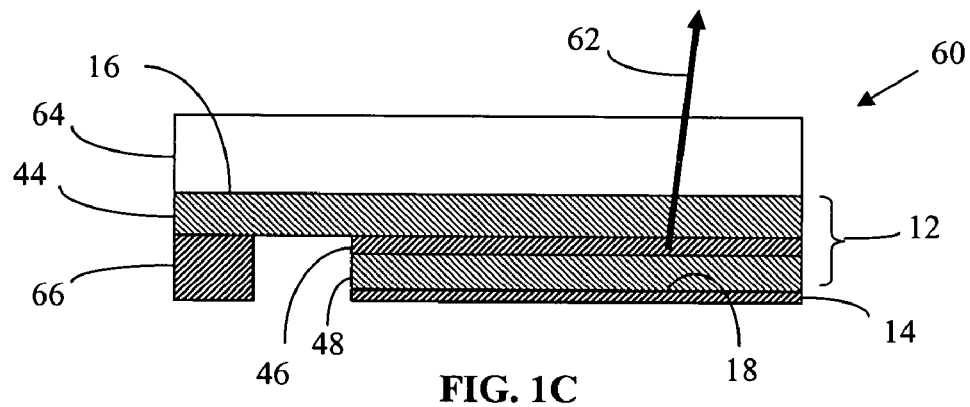
Figure 1D:
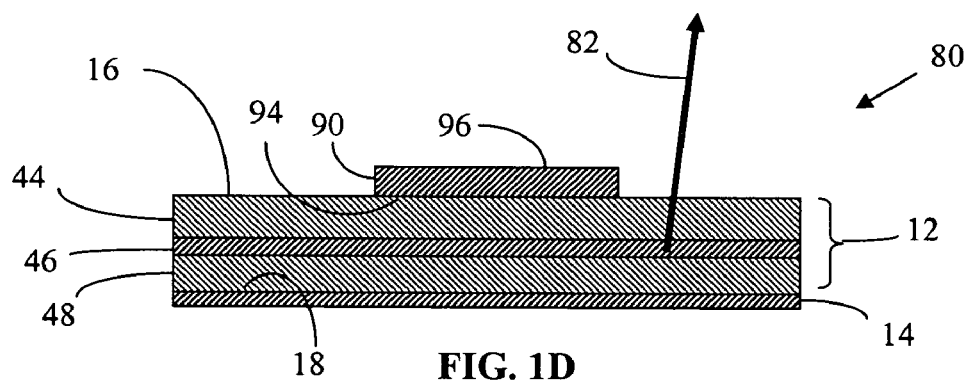

In order to better understand this invention, more detailed schematics of some example LED structures are shown in FIGS. 1B-1D. FIGS. 1B-1D explicitly illustrate example LED electrode structures and some of the elements that comprise the multi-layer semiconductor structure. These examples are for illustrative purposes only and are not meant to limit the scope of this invention to just these examples.

FIG. 1B illustrates the cross-section of LED 40. LED 40 is comprised of reflecting layer 14 that also serves as a bottom electrode, a multi-layer semiconductor structure 12, a substrate 42 and a top electrode 50. The multi-layer semiconductor structure 12 is epitaxially grown onto the substrate 42.

If LED 40 is a GaN LED, the multi-layer semiconductor structure 12 contains at least an n-doped GaN layer 44 that is usually adjacent to the substrate 42, an active layer 46 that emits internally generated light 52 and a p-doped GaN layer 48. The active layer 46 is typically a GaN-based multi-quantum well structure and is located between the n-doped GaN layer 44 and the p-doped GaN layer 48.

The substrate 42 of LED 40 must be at least partially transparent to the internally generated light 52. Substrate 42 must also be electrically conducting in order to form an electrical path between the n-doped layer 44 and the top electrode 50. A typical material for substrate 42 is doped silicon carbide (SiC), but other materials can be used. SiC is partially transparent, but does absorb some of the internally generated light 52. The absorption coefficient of SiC is approximately 2 $cm^{-1}$ in the wavelength region from 400-600 nanometers.

A metallic top electrode 50 is in contact with the electrically conducting substrate 42. The area of the top electrode 50 should be minimized in order for internally generated light 52 to escape from the uncovered area of the multi-layer semiconductor structure 12. The top electrode 50 should have high reflectivity in order to efficiently reflect both internally generated light hitting the bottom surface 54 of the top electrode 50 and incident light hitting the top surface 56 of the top electrode 50. Preferably the reflectivity of top electrode 50 is greater than 70%. More preferably, the reflectivity of the top electrode 50 is greater than 80%. Most preferably, the reflectivity of the top electrode 50 is greater than 90%. Appropriate metals for the top electrode 50 include silver, niobium and aluminum, but are not limited to these materials.

Alternatively, the material for the top electrode 50 can be a transparent conductor. If the material for the top electrode 50 is a transparent conductor, the light transmission of the transparent conductor is preferably greater than 90%. The transparent conductor is transmissive to the wavelengths of light generated by multi-layer semiconductor structure 12 of LED 40. Example transparent conductors include, but are not limited to, indium tin oxide (ITO or $In_2O_3$:Sn), fluorine-doped tin oxide ($SnO_2$:F) and aluminum-doped zinc oxide (ZnO:Al).

FIG. 1C illustrates the cross-section of LED 60. LED 60 is comprised of a reflecting layer 14 that also serves as a first bottom electrode, a multi-layer semiconductor structure 12, a substrate 64 and a second bottom electrode 66. The multi-layer semiconductor structure 12 is epitaxially grown onto the substrate 64.

If LED 60 is a GaN LED, the multi-layer semiconductor structure 12 contains at least an n-doped GaN layer 44 that is usually adjacent to the substrate 64, an active layer 46 that emits internally generated light 62 and a p-doped GaN layer 48. The active layer 46 is typically a GaN-based multi-quantum well structure and is located between the n-doped GaN layer 44 and the p-doped GaN layer 48.

The substrate 64 of LED 60 must be at least partially transparent to the internally generated light 62. In this example substrate 64 does not need to be electrically conductive. A typical material for substrate 64 is sapphire ($Al_2O_3$), which is transparent to visible light.

In order to form a second electrode, an etching process removes portions of the reflecting layer 14, the p-doped layer 48 and the active layer 46, thereby exposing a portion of the n-doped layer 44. A second metallic bottom electrode 66 is formed in contact with the exposed n-doped layer 44.

FIG. 1D illustrates the cross-section of LED 80. LED 80 is similar to LED 40 except that LED 80 does not have a partially transparent substrate. LED 80 is comprised of reflecting layer 14 that also serves as a bottom electrode, a multi-layer semiconductor structure 12 and a top electrode 90. The multi-layer semiconductor structure 12 is epitaxially grown onto a substrate, but the substrate is removed before the top electrode 90 is fabricated. For example, if the substrate is sapphire, a laser separation process can be used to remove the substrate from the multi-layer semiconductor structure 12.

If LED 80 is a GaN LED, the multi-layer semiconductor structure 12 contains at least an n-doped GaN layer 44, an active layer 46 that emits internally generated light 82 and a p-doped GaN layer 48. The active layer 46 is typically a GaN-based multi-quantum well structure and is located between the n-doped GaN layer 44 and the p-doped GaN layer 48.

A metallic top electrode 90 is in electrical contact with the n-doped GaN layer 44. The area of the top electrode 90 should be minimized in order for internally generated light to escape from the uncovered area of the multi-layer semiconductor structure 12. The top electrode 90 should have high reflectivity. Preferably the reflectivity of top electrode 90 is greater than 70%. More preferably, the reflectivity of the top electrode 90 is greater than 80%. Most preferably, the reflectivity of the top electrode 90 is greater than 90%. Appropriate metals for the top electrode 90 include, but are not limited to, silver, niobium and aluminum. Alternatively, the material for the top electrode 90 can be a transparent conductor. Appropriate transparent materials for the top electrode 90 are listed previously for the top electrode 50 in FIG. 1B.

Returning to the simplified schematic diagram of an LED shown in FIG. 1A, multi-layer semiconductor structure 12 of LED 10 emits internally generated light ray 20 through surface 16. Reflecting layer 14 reflects both internally generated light and incident light. Reflecting layer 14 can be a specular reflector or a diffuse reflector. Reflecting layer 14 is usually a metal layer. Appropriate metals include, but are not limited to, silver and aluminum. Reflecting layer 14 should have high reflectivity to the internally generated light and to incident light. Preferably the reflectivity of reflecting layer 14 is at least 80%. More preferably the reflectivity is at least 90%. Most preferably, the reflectivity is at least 95%.

Furthermore, LED 10 has a reflectivity to incident light. The reflectivity of LED 10 depends on several factors including the reflectivity of reflecting layer 14, the absorption coefficient of the multi-layer semiconductor structure 12 and the reflectivity of any top electrodes (not shown) that may be present. Preferably the reflectivity of LED 10 to incident light is at least 70%. More preferably, the reflectivity of LED 10 is at least 80%. Most preferably, the reflectivity of LED 10 is at least 90%.

Note that different sub-areas of an LED surface may not have the same reflectivity to incident light. For example, the sub-area of an LED surface covered by electrodes may have a different reflectivity than the sub-area not covered by electrodes. If different sub-areas of an LED surface do not have the same reflectivity, then the reflectivity of the LED is defined in this specification as the weighted average reflectivity for the entire surface of the LED. The weighting function is the fractional portion of the total area of the LED covered by each sub-area.

Figure 2A:
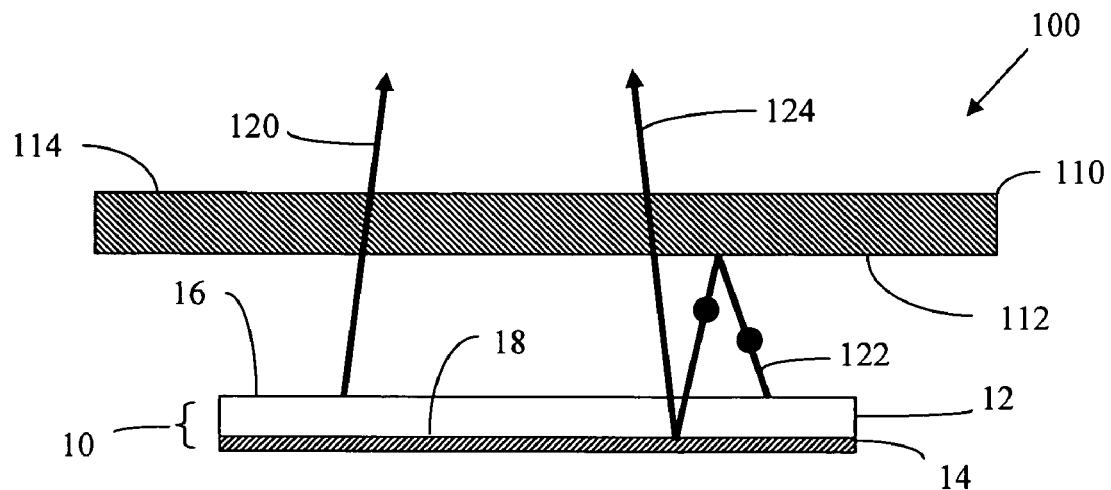
FIGS. 2A-2B are cross-sectional views of an embodiment of this invention that includes a non-absorbing reflecting polarizer.
Figure 2B:
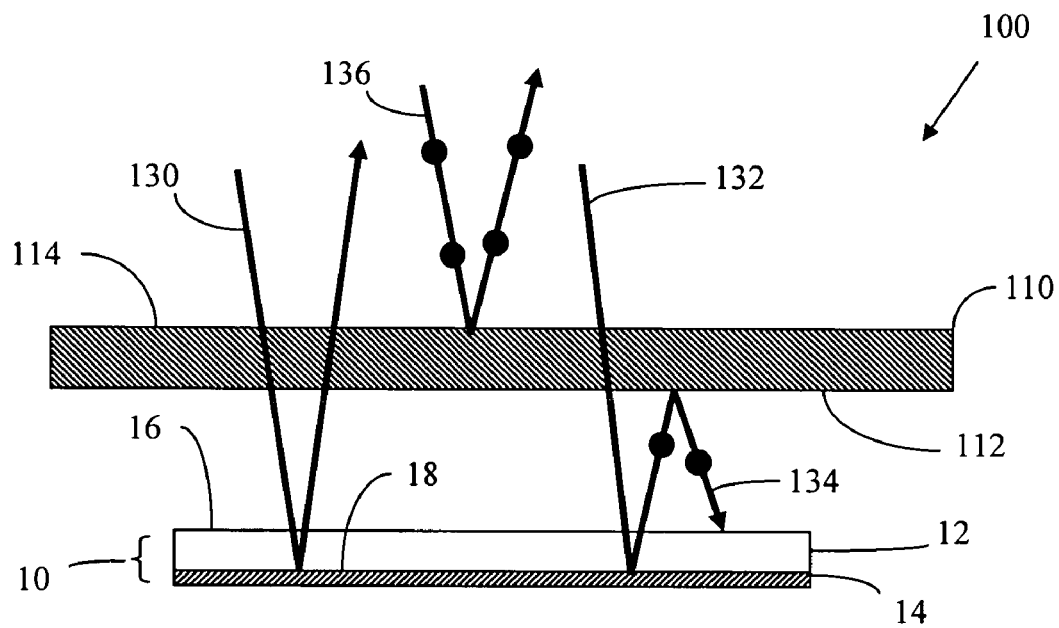

A cross-sectional view of one embodiment of this invention is illustrated in FIGS. 2A-2B. Illumination system 100 in FIG. 2A is comprised of LED 10 (illustrated previously in FIG. 1A) and a reflecting polarizer 110. The LED is shown in simplified form for ease of understanding the invention. Reflecting polarizer 110 is positioned in the light optical path of the light output of LED 10. Reflecting polarizer may be in contact with the surface 16 of LED 10 or may be in close proximity to LED 10 as illustrated in FIG. 2A. Reflecting polarizer 110 transmits a first polarization state of light emitted by multi-layer semiconductor structure 12 of LED 10 and reflects a second polarization state of light emitted by multi-layer semiconductor structure 12. The polarization states may be linear polarization states or circular polarization states. The reflecting polarizer has a first surface 112, adjacent to the LED 10, and a second surface 114, opposite the first surface 112 and the LED 10. The reflecting polarizer is non-absorbing to transmitted light and non-absorbing to reflected light. Exemplary reflecting polarizers are linear polarizers made by NanoOpto Corporation and Moxtek Incorporated that utilize subwavelength optical elements or wire-grid optical elements.

Internally generated light rays 120, 122 and 124 in FIG. 2A illustrate the operation of illumination system 100. Internally generated light ray 120 of a first polarization state is emitted through surface 16 of multi-layer semiconductor structure 12 and is directed towards the first surface 112 of the reflecting polarizer 110. Reflecting polarizer 110 transmits internally generated light ray 120 of a first polarization state through the first surface 112, through the reflecting polarizer 110 without absorption, to be emitted from the second surface 114.

Internally generated light ray 122 of a second polarization state (the second polarization state is illustrated as a solid line with superimposed dots) is emitted through surface 16 of multi-layer semiconductor structure 12 of LED 10 and directed towards the first surface 112 of the reflecting polarizer 110. The first surface 112 of the reflecting polarizer 110 reflects internally generated light ray 122 of a second polarization state without absorption back to LED 10. The light ray passes through surface 16 of LED 10 and passes through the multi-layer semiconductor structure 12 to reflecting layer 14 of LED 10. The light ray is reflected by reflecting layer 14, passes through the multi-layer semiconductor structure 12 and exits through surface 16. If reflecting layer 14 is a diffuse reflector or if the multi-layer semiconductor structure 12 scatters light, internally generated light ray 122 of a second polarization state may be converted to light ray 124 of a first polarization state during reflection by reflecting layer 14 or by passing through the multi-layer semiconductor structure. Light ray 124 of a first polarization state passes through the first surface 112 of reflecting polarizer 110, through the reflecting polarizer 110 without absorption, to be emitted from the second surface 114. The recycling of light ray 122 of a second polarization state back to LED 10 and the conversion to light ray 124 of a first polarization state increases the effective brightness of LED 10. The output brightness and the overall efficiency of light of a first polarization state exiting illumination system 100 are also increased. Alternatively, if light ray 122 of a second polarization state is not converted to light ray 124 of a first polarization state by reflecting from LED 10, reflecting polarizer 110 will again reflect light ray 122 of a second polarization state.

Reflecting polarizer 110 transmits internally generated light ray 120 of a first polarization state. Reflecting polarizer 110 reflects internally generated light ray 122 of a second polarization state. Overall, reflecting polarizer transmits a first portion of the internally generated light and reflects a second portion of the internally generated light back to LED 10.

Illumination system 100 also reflects incident light that comes from outside the illumination system. Incident light rays 130, 132 and 136 in FIG. 2B illustrate the operation of illumination system 100 to incident light. The incident light rays 130, 132 and 136 are generated externally to the LED 10 of the illumination system. Reflecting polarizer 110 transmits a first polarization state of incident light and reflects a second polarization state of incident light. The polarization states may be linear polarization states or circular polarization states. The reflecting polarizer is non-absorbing to transmitted incident light and non-absorbing to reflected incident light.

Incident light ray 130 of a first polarization state is directed towards the second surface 114 of the reflecting polarizer 110. Reflecting polarizer 110 transmits light ray 130 of a first polarization state through the second surface 114, through the reflecting polarizer 110 without absorption, to be emitted from the first surface 112. The light ray 130 is directed to the LED 10. The light ray passes through surface 16 of LED 10 and through the multi-layer semiconductor structure 12 to reflecting layer 14 of LED 10. The light ray is reflected by reflecting layer 14, passes through the multi-layer semiconductor structure 12 and exits through surface 16. If light ray 130 of a first polarization state is not converted to the second polarization state upon reflection by LED 10 as shown in FIG. 2B, then light ray 130 of a first polarization state passes through the first surface 112 of reflecting polarizer 110, through the reflecting polarizer 110 without absorption, to be emitted from the second surface 114.

Incident light ray 132 of a first polarization state is directed towards the second surface 114 of the reflecting polarizer 110. Reflecting polarizer 110 transmits light ray 132 of a first polarization state through the second surface 114, through the reflecting polarizer 110 without absorption, to be emitted from the first surface 112. The light ray 132 is directed to surface 16 of the LED 10. The light ray state passes through surface 16 of LED 10 and through the multi-layer semiconductor structure 12 to reflecting layer 14 of LED 10. The light ray is reflected by reflecting layer 14, passes through the multi-layer semiconductor structure 12 and exits LED 10 through surface 16 directed to reflecting polarizer 110. If reflecting layer 14 is a diffuse reflector or if the multi-layer semiconductor structure 12 scatters light, light ray 132 of a first polarization state may be converted to light ray 134 of a second polarization state during reflection by reflecting layer 14 or by passing through the multi-layer semiconductor structure. Light ray 134 of a second polarization state (the second polarization state is illustrated as a solid line with superimposed dots) is reflected by the first surface 112 of reflecting polarizer 110 and be directed back to LED 10.

Incident light ray 136 of a second polarization state is directed towards the second surface 114 of the reflecting polarizer 110. The second surface 114 of the reflecting polarizer 110 reflects light ray 136 of a second polarization state away from the illumination system 100 without absorption.

By effectively reflecting incident light from the reflecting polarizer 110 and from the LED 10, the output brightness and the overall efficiency of light exiting illumination system 100 are also increased.

Figure 3:
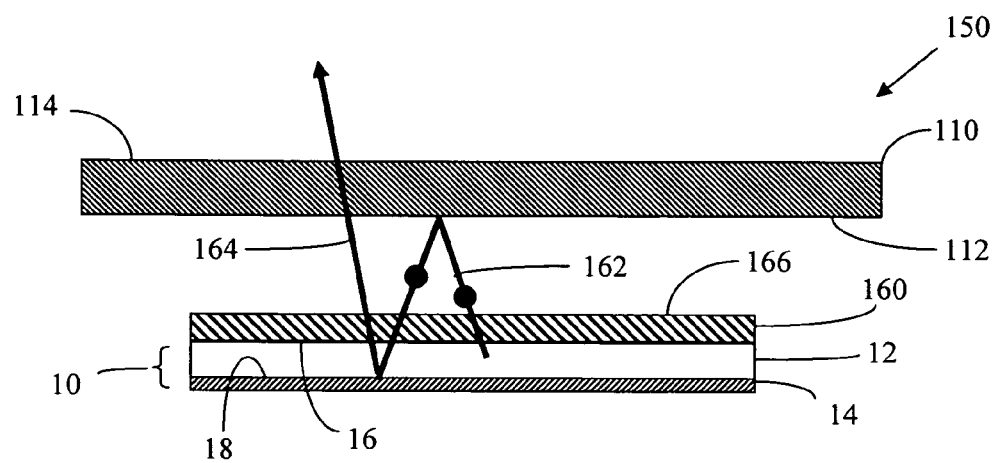
FIG. 3 is a cross-sectional view of an embodiment of this invention that includes a non-absorbing reflecting polarizer and a polarization mixing element.

FIG. 3 is a cross-sectional view of another embodiment of this invention, illumination system 150. Illumination system 150 is similar to illumination system 100 but further comprises a polarization mixing element 160. Polarization mixing element 160 increases the conversion of one polarization state to another polarization state. The conversion of polarization may be from a first polarization state to a second polarization state or from a second polarization state to a first polarization state. Examples of exemplary polarization mixing elements 160 include, but are not limited to, diffusers, arrays of micro lenses, retardation films and other polarization rotation elements. Polarization mixing element 160 is positioned in the light optical path and between multi-layer semiconductor structure 12 and reflecting polarizer 110. The multi-layer semiconductor structure 12, the polarization mixing element 160 and the reflecting polarizer 110 may be in physical contact or there may be gaps between the elements. For example, in FIG. 3 the polarization mixing element 160 is illustrated to be in contact with surface 16 of multi-layer semiconductor structure 12, but there is a gap between polarization mixing element 160 and reflecting polarizer 110.

Light rays 162 and 164 illustrate the operation of illumination system 150. Internally generated light ray 162 is emitted though surface 16 of LED 10 and is directed to polarization mixing element 160 with an indeterminate polarization state. After passing through surface 166 of polarization mixing element 160, internally generated light ray 162 has a second polarization state and is directed towards reflecting polarizer 110. The first surface 112 of the reflecting polarizer 110 reflects internally generated light ray 162 of a second polarization state without absorption back to LED 10. The light ray passes through polarization mixing element 160, through multi-layer semiconductor structure 12, is reflected by reflecting layer 14 and again passes through multi-layer semiconductor structure 12 and polarization mixing element 160. When the light ray emerges from surface 166, it has become light ray 164 of a first polarization state and is directed to reflecting polarizer 110. Reflecting polarizer 110 transmits light ray 164 of a first polarization state through the first surface 112, through the reflecting polarizer 110 without absorption, to be emitted from the second surface 114. The recycling of internally generated light ray 162 of a second polarization state back to LED 10 and the conversion to light ray 164 of a first polarization state increases the effective brightness of LED 10. The output brightness and the overall efficiency of light of a first polarization state exiting illumination system 150 are also increased.

Figure 4:
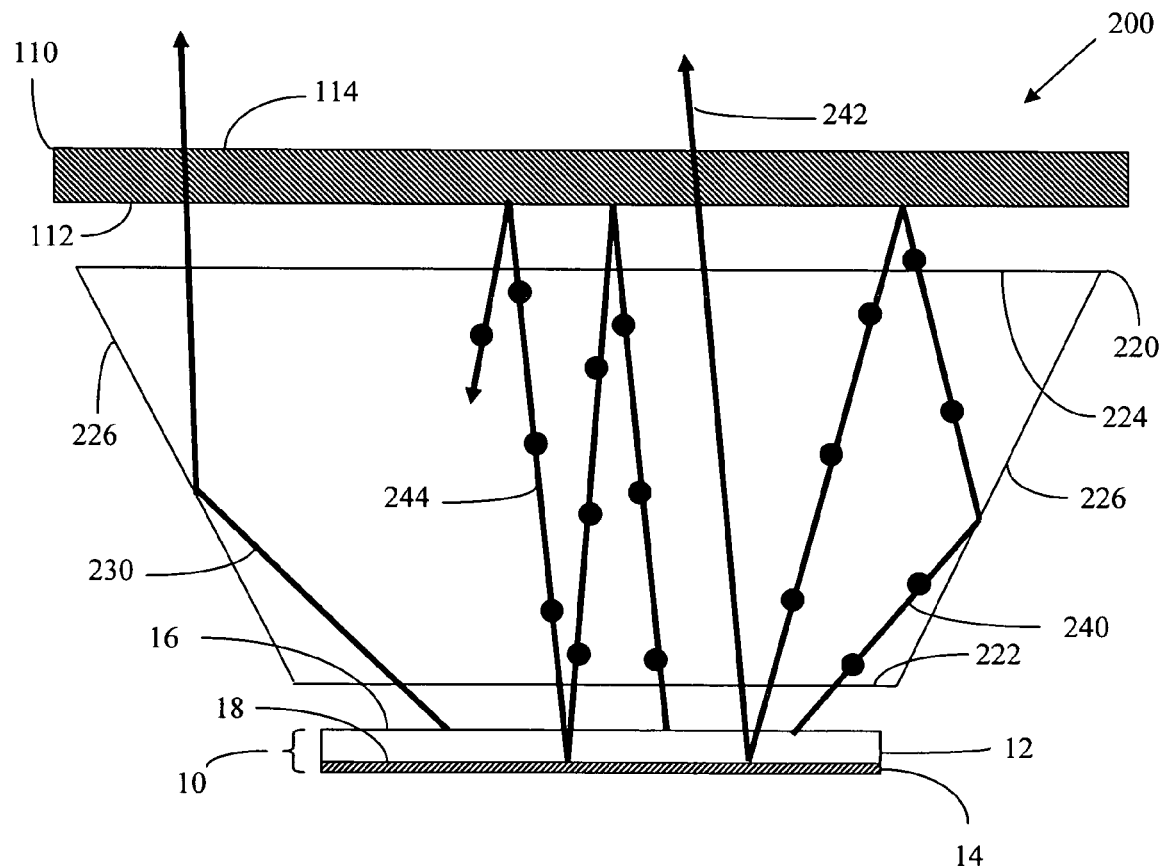
FIG. 4 is a cross-sectional view of another embodiment of this invention that includes a light collimating means.

Illumination system 200 illustrated in cross section in FIG. 4 is another embodiment of this invention. Illumination system 200 is similar to illumination system 100 but further comprises a light collimating means. The light collimating means may be, for example, a transparent tapered waveguide, a compound parabolic reflector, a lens or a combination of two or more such elements. In FIG. 4, the light collimating means is a tapered waveguide 220, which has an input surface 222, an output surface 224 and sides 226. In order for the tapered waveguide 220 to partially collimate the light, the area of the output surface 224 must be larger than the area of the input surface 222.

Light rays 230, 240, 242 and 244 illustrate the operation of illumination system 200. Multi-layer semiconductor structure 12 of LED 10 emits light ray 230 of a first polarization state through surface 16. Internally generated light ray 230 enters tapered waveguide 220 through input surface 222. Internally generated light ray 230 of a first polarization state is partially collimated by reflecting from a side surface 226 of the tapered waveguide 220. Internally generated light ray 230 of a first polarization state exits tapered waveguide 220 through output surface 224 as partially collimated light. Internally generated light ray 230 is directed to reflecting polarizer 110. Reflecting polarizer 110 transmits internally generated light ray 230 of a first polarization state through the first surface 112, through the reflecting polarizer 110 without absorption, to be emitted from the second surface 114.

Multi-layer semiconductor structure 12 of LED 10 emits internally generated light ray 240 of a second polarization state through surface 16. Internally generated light ray 240 of a second polarization state enters tapered waveguide 220 through input surface 222. Internally generated light ray 240 of a second polarization state is partially collimated by reflecting from a side surface 226 of the tapered waveguide 220. Internally generated light ray 240 of a second polarization state exits tapered waveguide 220 through output surface 224 as partially collimated light and is directed to reflecting polarizer 110. The first surface 112 of reflecting polarizer 110 reflects internally generated light ray 240 of a second polarization state back through tapered waveguide 220 to LED 10. The light ray passes through surface 16 of LED 10 and passes through the multi-layer semiconductor structure 12 to reflecting layer 14 of LED 10. The light ray is reflected by reflecting layer 14, passes through the multi-layer semiconductor structure 12 and exits through surface 16. As stated previously, if reflecting layer 14 is a diffuse reflector or if the multi-layer semiconductor structure 12 scatters light, internally generated light ray 240 of a second polarization state may be converted to light ray 242 of a first polarization state during reflection by reflecting layer 14 or by passing through the multi-layer semiconductor structure. Light ray 242 of a first polarization state is transmitted through tapered waveguide 220. Light ray 242 of a first polarization state passes through the first surface 112 of reflecting polarizer 110, through the reflecting polarizer 110 without absorption, to be emitted from the second surface 114. The recycling of internally generated light ray 240 of a second polarization state back to LED 10 and the conversion to light ray 242 of a first polarization state increases the effective brightness of LED 10. The output brightness and the overall efficiency of light of a first polarization state exiting illumination system 200 are also increased.

Multi-layer semiconductor structure 12 of LED 10 emits internally generated light ray 244 of a second polarization state through surface 16. Internally generated light ray 244 of a second polarization state enters tapered waveguide 220 through input surface 222. Internally generated light ray 244 of a second polarization state exits tapered waveguide 220 through output surface 224 as partially collimated light and is directed to reflecting polarizer 110. The first surface 112 of reflecting polarizer 110 reflects without absorption internally generated light ray 244 of a second polarization state back through tapered waveguide 220 to LED 10. The internally generated light ray 244 passes through surface 16 of LED 10 and passes through the multi-layer semiconductor structure 12 to reflecting layer 14 of LED 10. The internally generated light ray 244 of a second polarization state is reflected by reflecting layer 14, passes through the multi-layer semiconductor structure 12, exits through surface 16 and is directed through tapered waveguide 220 to reflecting polarizer 110. Internally generated light ray 244 of a second polarization state is not converted to light of a first polarization state while passing through the multi-layer semiconductor structure 12 or during reflection from reflecting layer 14. Internally generated light ray 244 is reflected without absorption a second time by the first surface 112 of reflecting polarizer 110 and directly back to LED 10.

Internally generated light ray 240 of a second polarization state is converted to light ray 242 of a first polarization state upon reflection by LED 10. Internally generated light ray 244 of a second polarization state is not converted to a first polarization state upon reflection by LED 10. Overall, a fraction of the light of a second polarization state is converted to light of a first polarization state upon reflection by LED 10.

Light that is reflected by LED 10 can increase the effective brightness of LED 10. The output brightness and the overall efficiency of light of a first polarization state exiting illumination system 200 are also increased. As in illumination system 150, a polarization mixing element (not shown) may increase the conversion of light of a second polarization state into light of a first polarization state.

Figure 5A:
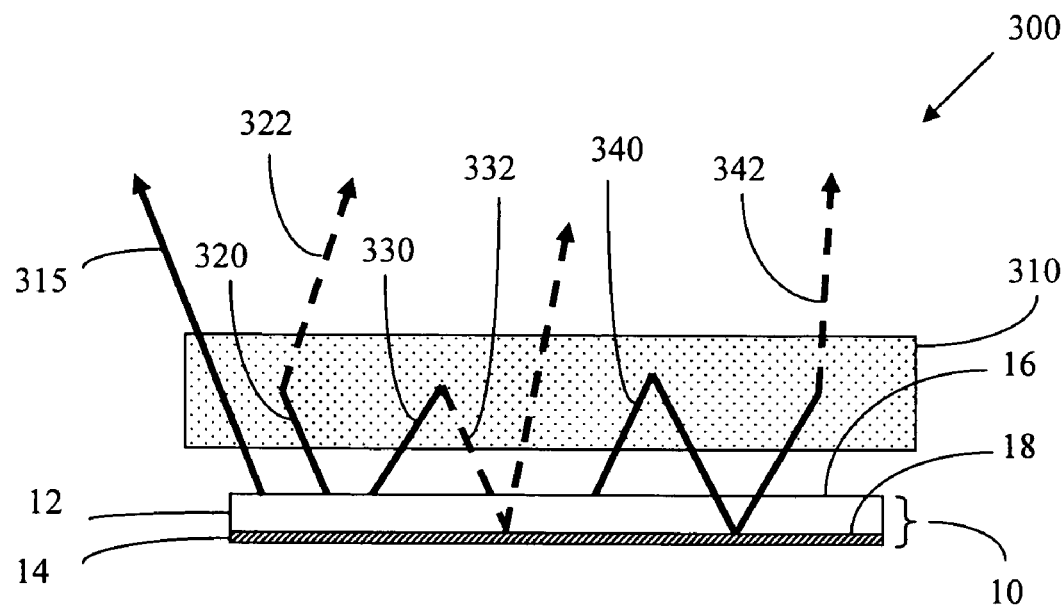
FIGS. 5A-5B are cross-sectional views of another embodiment of this invention that incorporates a light emitting diode and a wavelength conversion layer.

Illumination system 300, illustrated in cross section in FIG. 5, is another embodiment of this invention. In illumination system 300, the partially reflecting optical element is a wavelength conversion layer 310 that transmits a first portion of the internally generated light and reflects a second portion of the internally generated light back to LED 10. In addition, wavelength conversion layer 310 converts a fraction of the internally generated light emitted by LED 10 into light having a different wavelength. The light having a different wavelength has a longer wavelength than the internally generated light. The light having a different wavelength may be partially transmitted by the wavelength conversion layer 310 and partially reflected by the wavelength conversion layer back to LED 10. LED 10 has been described previously.

The wavelength conversion layer 310 is comprised of a phosphor material, a quantum dot material or a plurality of such materials. The wavelength conversion layer may further comprise a transparent host material into which the phosphor material or the quantum dot material is dispersed. Wavelength conversion layers that contain powdered phosphor materials can scatter light. When wavelength conversion layer 310 scatters light, it can also transmit and reflect portions of the scattered light.

Phosphor materials are typically optical inorganic materials doped with ions of lanthanide (rare earth) elements or, alternatively, ions such as chromium, titanium, vanadium, cobalt or neodymium. The lanthanide elements are lanthanum, cerium, praseodymium, neodymium, promethium, samarium, europium, gadolinium, terbium, dysprosium, holmium, erbium, thulium, ytterbium and lutetium. Optical inorganic materials include, but are not limited to, sapphire ($Al_2O_3$), gallium arsenide (GaAs), beryllium aluminum oxide ($BeAl_2O_4$), magnesium fluoride ($MgF_2$), indium phosphide (InP), gallium phosphide (GaP), yttrium aluminum garnet (YAG or $Y_3Al_5O_{12}$), terbium-containing garnet, yttrium-aluminum-lanthanide oxide compounds, yttrium-aluminum-lanthanide-gallium oxide compounds, yttrium oxide ($Y_2O_3$), calcium or strontium or barium halophosphates $(Ca,Sr,Ba)_5(PO_4)_3(Cl,F)$, the compound $CeMgAl_{11}O_{19}$, lanthanum phosphate ($LaPO_4$), lanthanide pentaborate materials ($(lanthanide)(Mg,Zn)B_5O_{10}$), the compound $BaMgAl_{10}O_{17}$, the compound $SrGa_2S_4$, the compounds $(Sr,Mg,Ca,Ba)(Ga,Al,In)_2S_4$, the compound SrS, the compound ZnS and nitridosilicate. There are several exemplary phosphors that can be excited at 250 nm or thereabouts. An exemplary red emitting phosphor is $Y_2O_3$:$Eu^{3+}$. An exemplary yellow emitting phosphor is YAG:$Ce^{3+}$. Exemplary green emitting phosphors include $CeMgAl_{11}O_{19}$:$Tb^{3+}$, $((lanthanide)PO_4$:$Ce^{3+},Tb^{3+})$ and $GdMgB_5O_{10}$:$Ce^{3°},Tb^{3+}$. Exemplary blue emitting phosphors are $BaMgAl_{10}O_{17}$:$Eu^{2+}$ and $(Sr,Ba,Ca)_5(PO_4)_3Cl$:$Eu^{2+}$. For longer wavelength LED excitation in the 400-450 run wavelength region or thereabouts, exemplary optical inorganic materials include yttrium aluminum garnet (YAG or $Y_3Al_5O_{12}$), terbium-containing garnet, yttrium oxide ($Y_2O_3$), $YVO_4$, $SrGa_2S_4$, $(Sr,Mg,Ca,Ba)(Ga,Al,In)_2S_4$, SrS, and nitridosilicate. Exemplary phosphors for LED excitation in the 400-450 nm wavelength region include YAG:$Ce^{3+}$, YAG:$Ho^{3+}$, YAG:$Pr^{3+}$, $SrGa_2S_4$:$Eu^{2+}$, $SrGa_2S_4$:$Ce^{3+}$, SrS:$Eu^{2+}$ and nitridosilicates doped with $Eu^{2+}$.

Quantum dot materials are small particles of inorganic semiconductors having particle sizes less than about 30 nanometers. Exemplary quantum dot materials include, but are not limited to, small particles of CdS, CdSe, ZnSe, InAs, GaAs and GaN. Quantum dot materials can absorb light at one wavelength and then re-emit the light at different wavelengths that depend on the particle size, the particle surface properties, and the inorganic semiconductor material.

The transparent host materials include polymer materials and inorganic materials. The polymer materials include, but are not limited to, acrylates, polystyrene, polycarbonate, fluoroacrylates, perfluoroacrylates, fluorophosphinate polymers, fluorinated polyimides, polytetrafluoroethylene, fluorosilicones, sol-gels, epoxies, thermoplastics, thermosetting plastics and silicones. Fluorinated polymers are especially useful at ultraviolet wavelengths less than 400 nanometers and infrared wavelengths greater than 700 nanometers owing to their low light absorption in those wavelength ranges. Exemplary inorganic materials include, but are not limited to, silicon dioxide, optical glasses and chalcogenide glasses.

A single type of phosphor material or quantum dot material may be incorporated in the wavelength conversion layer or a mixture of phosphor materials and quantum dot materials may be incorporated into the wavelength conversion layer. Utilizing a mixture of more than one such material is advantageous if a broad spectral emission range is desired.

LED 10 in illumination system 300 reflects incident light. Preferably the reflectivity of LED 10 to incident light is 70%. More preferably, the reflectivity of LED 10 is 80%. Most preferably, the reflectivity of LED 10 is 90%.

Representative light rays in FIG. 5 illustrate the operation of illumination system 300. In this figure, solid lines illustrate internally generated light rays and dashed lines illustrate wavelength converted light rays.

Multi-layer semiconductor structure 12 emits internally generated light ray 315 through surface 16. Internally generated light ray 315 passes through wavelength conversion layer 310 without reflection and without conversion.

Multi-layer semiconductor structure 12 emits internally generated light ray 320. Internally generated light ray 320 passes through surface 16 and a portion of wavelength conversion layer 310. Wavelength conversion layer 310 converts internally generated light ray 320 into wavelength converted light ray 322 having a different wavelength. Wavelength converted light ray 322 exits the illumination system.

Multi-layer semiconductor structure 12 emits internally generated light ray 330. Internally generated light ray 330 passes through surface 16 and through a portion of wavelength conversion layer 310. Wavelength conversion layer 310 converts the internally generated light ray 330 into wavelength converted light ray 332 having a different wavelength. Wavelength converted light ray 332 is directed back to LED 10 and is reflected by reflecting layer 14 of LED 10, thereby increasing the effective brightness of LED 10. Wavelength converted light ray 332 passes through wavelength conversion layer 310 and exits illumination system 300.

Multi-layer semiconductor structure 12 emits internally generated light ray 340. Internally generated light ray 340 passes through surface 16 and through a portion of wavelength conversion layer 310. Wavelength conversion layer 310 reflects internally generated light ray 340 back to LED 10. Internally generated light ray 340 represents a second portion of internally generated light that is reflected back to LED 10 where it is reflected by reflecting layer 14 and increases the effective brightness of LED 10. Internally generated light ray 340 enters wavelength conversion layer 310 a second time. Internally generated light ray 340 is converted to wavelength converted light ray 342 having a different wavelength. Wavelength converted light ray 342 passes through the remainder of wavelength conversion layer 310 and exits illumination system 300.

The wavelength conversion layer 310 transmits internally generated light ray 315. The wavelength conversion layer reflects internally generated light ray 340. Overall, the wavelength conversion layer 310 transmits a first portion of the internally generated light and reflects a second portion of the internally generated light back to LED 10.

Internally generated light ray 315 passes through wavelength conversion layer 310 without conversion to light of a different wavelength. Wavelength conversion layer 310 converts internally generated light ray 320 to light ray 322 having a different wavelength. Wavelength conversion layer 310 converts internally generated light ray 330 to light ray 332 having a different wavelength. Wavelength conversion layer 310 converts internally generated light ray 340 to light ray 342 having a different wavelength. Overall, wavelength conversion layer 310 converts a fraction of the internally generated light into light having a different wavelength.

Illumination system 300 also reflects incident light that comes from outside the illumination system. The wavelength conversion layer 310 of illumination system 300 can both reflect incident light and transmit incident light. Reflecting layer 14 of LED 10 of illumination system 300 can reflect incident light. Light that is reflected by the wavelength conversion layer 310 or LED 10 can increase the effective brightness of illumination system 300.

Figure 5B:
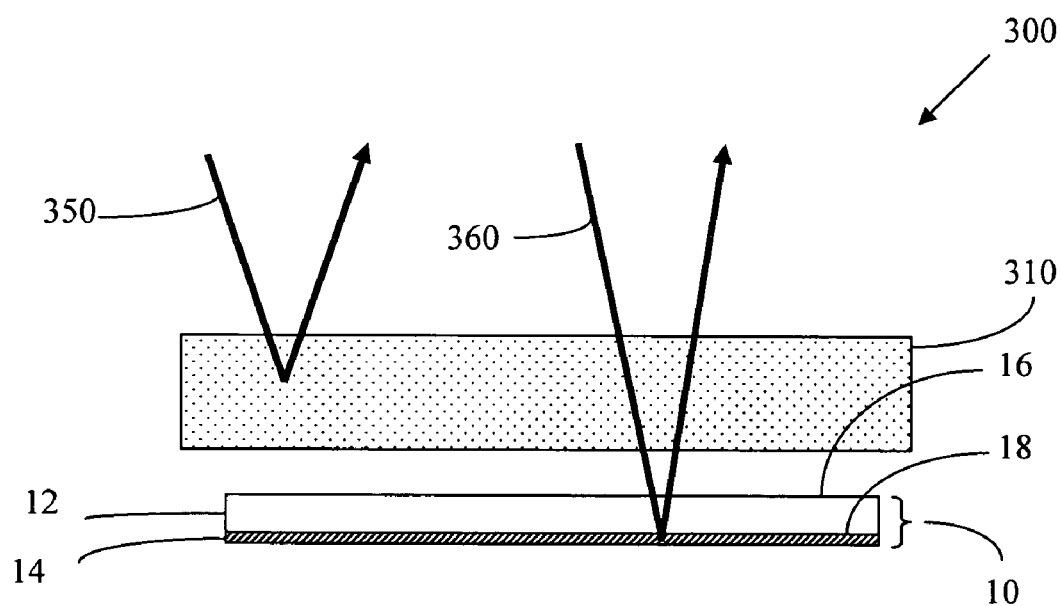

Incident light rays 350 and 360 in FIG. 5B illustrate the operation of illumination system 300 to incident light. The incident light rays 350 and 360 are generated externally to the LED 10 of the illumination system and are illustrated as solid lines.

Incident light ray 350 is directed to wavelength conversion layer 310. Wavelength conversion layer 310 may either reflect or transmit light rays. In this example, wavelength conversion layer 310 reflects incident light ray 350.

Incident light ray 360 is directed to wavelength conversion layer 310. Wavelength conversion layer 310 may either reflect or transmit light rays. Wavelength conversion layer 310 transmits incident light ray 360 to LED 10. Incident light ray 360 is transmitted through surface 16 and through the multi-layer semiconductor structure 12 to reflecting layer 14. Reflecting layer 14 reflects incident light ray 360. Incident light ray 360 again passes through the multi-layer semiconductor structure 12, through surface 16 and is directed to the wavelength conversion layer 310. Wavelength conversion layer 310 may either reflect or transmit light rays. In this example, wavelength conversion layer 310 transmits incident light ray 360.

While the invention has been described in conjunction with specific embodiments, it is evident to those skilled in the art that many alternatives, modifications and variations will be evident in light of the foregoing descriptions. Accordingly, the invention is intended to embrace all such alternatives, modifications and variations as fall within the spirit and scope of the appended claims.

What is claimed is:

1. An illumination system for emitting internally generated light and reflecting incident light, comprising:
    a light emitting diode having an active layer for emitting internally generated light and a reflecting layer for reflecting light; and
    a partially reflecting optical element, wherein said partially reflecting optical element is located in the light optical path of said internally generated light emitted from said light emitting diode, wherein said partially reflecting optical element transmits a first portion of said internally generated light, wherein said partially reflecting optical element reflects a second portion of said internally generated light back to said light emitting diode, where said second portion of said internally generated light is reflected by said reflecting layer of said light emitting diode, wherein said partially reflecting optical element transmits a first portion of said incident light to said light emitting diode, where said first portion of said incident light is reflected by said reflecting layer of said light emitting diode back to said partially reflecting optical element, wherein the reflectivity of said light emitting diode to said incident light is at least 70 percent, and wherein said partially reflecting optical element reflects a second portion of said incident light.

2. The illumination system for emitting internally generated light and reflecting incident light as in claim 1, wherein said partially reflecting optical element is a reflecting polarizer and wherein said reflecting polarizer transmits light of a first polarization state and reflects light of a second polarization state.

3. The illumination system for emitting internally generated light and reflecting incident light as in claim 2, wherein said reflecting polarizer is non-absorbing for said internally generated light and said incident light.

4. The illumination system for emitting internally generated light and reflecting incident light as in claim 2, further comprising: a polarization mixing element, wherein said polarization mixing element is located in said light optical path between said light emitting diode and said reflecting polarizer and wherein said polarization mixing element increases the conversion of light of a second polarization state into light of a first polarization state.

5. The illumination system for emitting internally generated light and reflecting incident light as in claim 2, further comprising: a light collimating means, wherein said light collimating means is located in said light optical path between said light emitting diode and said reflecting polarizer and wherein said light collimating means partially collimates said internally generated light.

6. The illumination system for emitting internally generated light and reflecting incident light as in claim 5, wherein said light collimating means is a lens, a tapered waveguide or a compound parabolic reflector.

7. The illumination system for emitting internally generated light and reflecting incident light as in claim 1, wherein said partially reflecting optical element is a wavelength conversion layer that converts a fraction of said internally generated light into light having a different wavelength.

8. The illumination system for emitting internally generated light and reflecting incident light as in claim 1, wherein the reflectivity of said light emitting diode to said incident light is at least 80 percent.

9. The illumination system for emitting internally generated light and reflecting incident light as in claim 1, wherein the reflectivity of said light emitting diode to said incident light is at least 90 percent.

* * * * *